United States Patent [19]
Wong et al.

[11] Patent Number: 5,753,133
[45] Date of Patent: May 19, 1998

[54] METHOD AND APPARATUS FOR ETCHING FILM LAYERS ON LARGE SUBSTRATES

[75] Inventors: Jerry Wong, Fremont; Masato M. Toshima, Sunnyvale; Kam S. Law, Union City; Dan Maydan, Los Altos Hills; Norman L. Turner, Mountain View, all of Calif.

[73] Assignee: Applied Komatsu Technology, Inc., Tokyo, Japan

[21] Appl. No.: 273,382

[22] Filed: Jul. 11, 1994

[51] Int. Cl.⁶ .................................. H05H 1/00
[52] U.S. Cl. .................. 216/67; 156/345; 414/436; 414/941; 414/939; 118/503; 118/728
[58] Field of Search .................. 156/345; 118/728, 118/503, 500; 414/222, 935, 936, 941, 939; 216/67

[56] References Cited

U.S. PATENT DOCUMENTS

| | | | |
|---|---|---|---|
| 3,993,909 | 11/1976 | Drews et al. | 250/492 A |
| 4,376,672 | 3/1983 | Wang et al. | 156/643 |
| 4,419,076 | 12/1983 | Kirshman | 373/18 |
| 4,553,069 | 11/1985 | Purser | 315/111.81 |
| 4,579,080 | 4/1986 | Martin et al. | 118/724 |
| 4,728,389 | 3/1988 | Logar | 134/1 |
| 4,788,994 | 12/1988 | Shinbara | 134/157 |
| 4,842,683 | 6/1989 | Cheng et al. | 156/345 |
| 4,911,597 | 3/1990 | Maydan et al. | 614/217 |
| 5,100,502 | 3/1992 | Murdoch et al. | 156/643 |
| 5,104,276 | 4/1992 | Severns et al. | 118/725 |
| 5,154,730 | 10/1992 | Hodos et al. | 29/25.01 |
| 5,183,245 | 2/1993 | DiNapoli et al. | 269/254 R |
| 5,268,067 | 12/1993 | Dostalik et al. | 156/643 |
| 5,515,986 | 5/1996 | Turlot et al. | 156/345 X |

*Primary Examiner*—Thi Dang
*Attorney, Agent, or Firm*—Fish & Richardson, P.C.

[57] ABSTRACT

A chamber for processing substrates includes a support member therein which is suspended from a sidewall of the chamber. The support member includes multiple planar faces for receiving substrates thereon, and is rotatable about a horizontal axis to position the multiple planar faces in a horizontal position to place the substrates on the planar faces or remove the substrates from the planar faces, and a second position to place the substrates in a non-horizontal position for processing. A clamping and lifting apparatus is provided on the support member. The clamping and lifting apparatus is positionable, with respect to the support member, in an extended position to permit a substrate to be positioned between the clamping and lifting assembly and the support member, and in a retracted position to clamp the substrate to the support member. A clamp actuator is disposed on the chamber wall to move the clamping and lifting assembly between the extended and retracted positions.

35 Claims, 8 Drawing Sheets

METHOD AND APPARATUS FOR ETCHING FILM LAYERS ON LARGE SUBSTRATES

BACKGROUND OF THE INVENTION

1. Field of the Invention

The present invention relates to the field of etching of film layers on substrates, including the etching of film layers formed on semiconductor substrates and on insulative substrates, such as glass substrates, to selectively remove portions of the film layer. More particularly, the present invention has application to the etching of film layers on large planar surfaces such as those encountered in the fabrication of large flat panel displays.

2. Background of the Art

Selective etching of film layers on semiconductor substrates is well known. For example, U.S. Pat. No. 4,367,672, Wang, et al., fully incorporated herein by reference, discloses methods of using a plasma to selectively etch holes or trenches in a film layer on a semiconductor substrate. Currently used semiconductor substrates are typically circular, having a diameter of no more than 200 mm, a thickness of less than 0.5 mm, and a mass of no more than approximately 60 g. Because of the relatively small size and weight of the semiconductor substrate, relatively straightforward etch chamber configurations may be used to provide the etch process environment to selectively etch a film layer on the substrate, and relatively straightforward wafer handling equipment may be used to load the substrates into processing chambers.

The process for manufacturing flat panel displays uses many of the same processes used to fabricate semiconductor devices. The manufacture of the flat panel display begins with a clean glass substrate. Transistors are formed on the flat panel using film deposition and selective etching techniques similar to those described in the aforementioned Wang, et al. patent. Sequential deposition, photolithography and selective etching of film layers on the substrate creates individual transistors on the substrate. These devices, as well as metallic interconnects, liquid crystal cells and other devices formed on the substrate are then used to create active matrix display screens on the substrate to create a flat panel display in which display states are electrically created in the individual pixels.

Although the flat panel display is typically manufactured using the same processes as those used in semiconductor device fabrication, the glass used as the flat panel display substrate is different than a semiconductor substrate in several important respects that affect its processing. In semiconductor fabrication, individual devices are formed on the wafer, and the wafer is diced to form multiple individual integrated circuits. Thus, the creation of some defective devices on the semiconductor wafer is tolerated, because the die bearing these defective devices are simply discarded once the substrate is sawn into individual integrated circuits. On the flat panel display, individual defective devices must not be removed. Therefore, the number of defective devices created on the flat panel substrate must approach zero. If a substrate is sufficiently large to process multiple displays on a single substrate, a defect in any one of the flat panel displays being formed on the flat panel substrate renders that display defective. Additionally, the glass substrates are typically substantially larger than the largest semiconductor wafers, and the coefficient of heat transfer of the glass substrate is approximately 100 times less than the coefficient of heat transfer of the semiconductor substrate.

In semiconductor processing, in particular etch processing, the process environment transfers substantial energy into the substrate, and this raises the temperature of the substrate if the energy is not distributed away from the surface of the substrate and/or removed from the substrate at the same rate as it enters the substrate. In semiconductor substrate processing, the substrate temperature is maintained at a desired level by balancing the energy transferred into the substrate by the process environment with the combination of the capacity of the substrate to distribute the heat away from the surface and the rate at which heat is transferred from the substrate into the substrate support member. As the substrate is heated by the process environment, the temperature of the substrate outer surface is raised by the energy transferred into the substrate. As the etch process continues, the heat conducts into the substrate to raise the temperature in the remainder of the substrate. A portion of this heat is eventually conducted into the support member. By balancing the total energy transferred into the substrate during the etch process, and the rate of energy transfer into the substrate, the temperature of the substrate surface may be maintained below the resist breakdown temperature of 120 degrees Celsius.

Where a substrate is received on a support member but not firmly chucked thereto, the rate of heat transfer from the substrate into the support member is relatively small because the vacuum process environment substantially prevents conductive heat transfer between the substrate and the support member in areas where the support member and the substrate are not in intimate contact. Therefore, where the substrate is simply mechanically coupled to the support member, the power must be maintained at relatively low levels so that the energy input into the substrate does not exceed the combination of the rate of heat transfer from the substrate into the support member and the diffusion of the heat energy within the substrate. However, because etch rate and power density are approximately directly proportional, these low energy levels limit throughput of substrates through the chamber because longer process times are required to effect a desired etch. To increase throughput, semiconductor substrates may be cooled by trapping a gas between the substrate and the support member. For maximum heat transfer, and thus maximum throughput, the substrate is clamped to the support member, and the gas is maintained between the substrate and the support member at a pressure above the chamber pressure.

The temperature control methods used for semiconductor substrate processing are adaptable, in part, to flat panel display substrates. Where the flat panel display substrate is relatively small, for example less than 5,000 $cm^2$, semiconductor processing cooling techniques, including mechanically clamping the substrate to the support member and backside cooling the substrate with a trapped gas volume are generally acceptable. However, because the glass used as the flat panel substrate has a much lower coefficient of heat transfer, backside gas cooling is not as efficient as in semiconductor processing because the rate of heat transfer through the substrate is approximately 100 times less than that of a silicon substrate. Further, as the size of the substrate is increased to allow for the fabrication of multiple panels on a single substrate, for example, where the substrate is as large as 550 mm by 650 mm, mechanically clamping of the substrate to the support member and maintaining pressurized gas between the substrate and the support member will cause the glass to bow out from the support member and break. Therefore, the processing of larger glass substrates is limited to the use of low power levels, so that the temperature in the substrate may be maintained at an acceptable level. With a glass substrate approximately 1.1 mm thick and a thermal conductivity of 10 to 11 mW/cm/K, a power density of 0.25 to 1.25 w/cm² may be maintained without backside cooling and without raising the substrate surface temperature at the resist above 120 degrees Celsius.

Additionally, the large, rectangular, glass sheet used as the substrate is heavy and bulky but nonetheless fragile, and cannot be easily manipulated between the horizontal and vertical planes. Therefore, the plasma etch processes used to selectively etch the film layer on a flat panel substrate are typically performed with the substrate located in a horizontal position, because it is easier to handle the substrate in process if it is loaded into a process chamber in the horizontal plane.

The process chemistries used to create flat panel displays using amorphous silicon layers also contribute to the creation of defective displays. In flat panel display panels, the holes or trenches etched in the film layers must typically have tapered walls. Typically, where the layer being etched is amorphous silicon fluorine based chemistries are used to for etching. To provide the tapered side walls using a fluorine based chemistry, oxygen is introduced into the etch chemistry. As the fluorine based chemistry etches the film layer, the oxygen continuously etches the edge of the resist to continuously reduce the width of the resist and thus increase the width of the area of the film being etched to create the desired tapered walls. However, the oxygen used to etch the edge of the resist also forms particle contaminants in the chamber, which, if received on the substrate, will cause a particle defect.

The processing of a single glass substrate in a horizontal position is an unsatisfactory approach to the etching of the substrates. In the typical etch process for a horizontal flat panel substrate, the etch plasma is maintained within the chamber enclosure above the substrate. Therefore, as the film layer is etched, contaminants in the enclosure fall by the force of gravity onto the substrate, and contaminants may also be electrostatically attracted to the substrate. Each of these contaminants above a threshold size will produce a defect in a flat panel formed on the substrate.

Therefore, there exists a need in the art for substrate processing equipment, such as etching apparatus, that will allow etching of flat panel apparatus with maximum throughput and minimal process variation.

SUMMARY OF THE INVENTION

The present invention provides a processing chamber for processing substrates, preferably an etch chamber for etching film layers on substrates such as flat panel display and other large substrates, wherein the film layers on the exposed surfaces of multiple substrates may be simultaneously etched in a single etch chamber.

In the preferred embodiment, the apparatus is configured as a reactive ion etch chamber wherein a substrate support member, having multiple substrate receiving faces, is disposed in the chamber and is rotatable about a horizontal axis to position the substrate receiving faces of the support member in a horizontal plane for the loading of substrates onto, or removal of substrates from, the substrate support member. The substrate support member also includes a clamping means to maintain the substrates on the substrate support member as the substrate support member is rotated in the chamber.

The substrate support member is preferably configured to receive two substrates thereon for simultaneous processing in the chamber. Where the substrate support member is configured to simultaneously process two substrates, the substrates may be placed on opposed sides of the substrate support member, and loaded into the chamber in a horizontal position and, after placement on the substrate support member, rotated to place the substrates in a vertical, or nearly vertical, position for etching. Although the apparatus is preferably configured for reactive ion etching of the exposed film layer on the substrate wherein the support member is configured as a cathode, other etch processes, such as a triode configuration or a remote source where a plasma is formed exterior of the chamber and flowed past the substrate, may be used with the process apparatus of the present invention. Indeed, the geometry can advantageously be applied to other processes, such as chemical vapor deposition and deposition sputtering.

These, and other features of our invention will be apparent from the following description of the embodiments, when read in conjunction with the following drawings, wherein:

DESCRIPTION OF THE EMBODIMENTS

Introduction to the Apparatus

Figure 1:
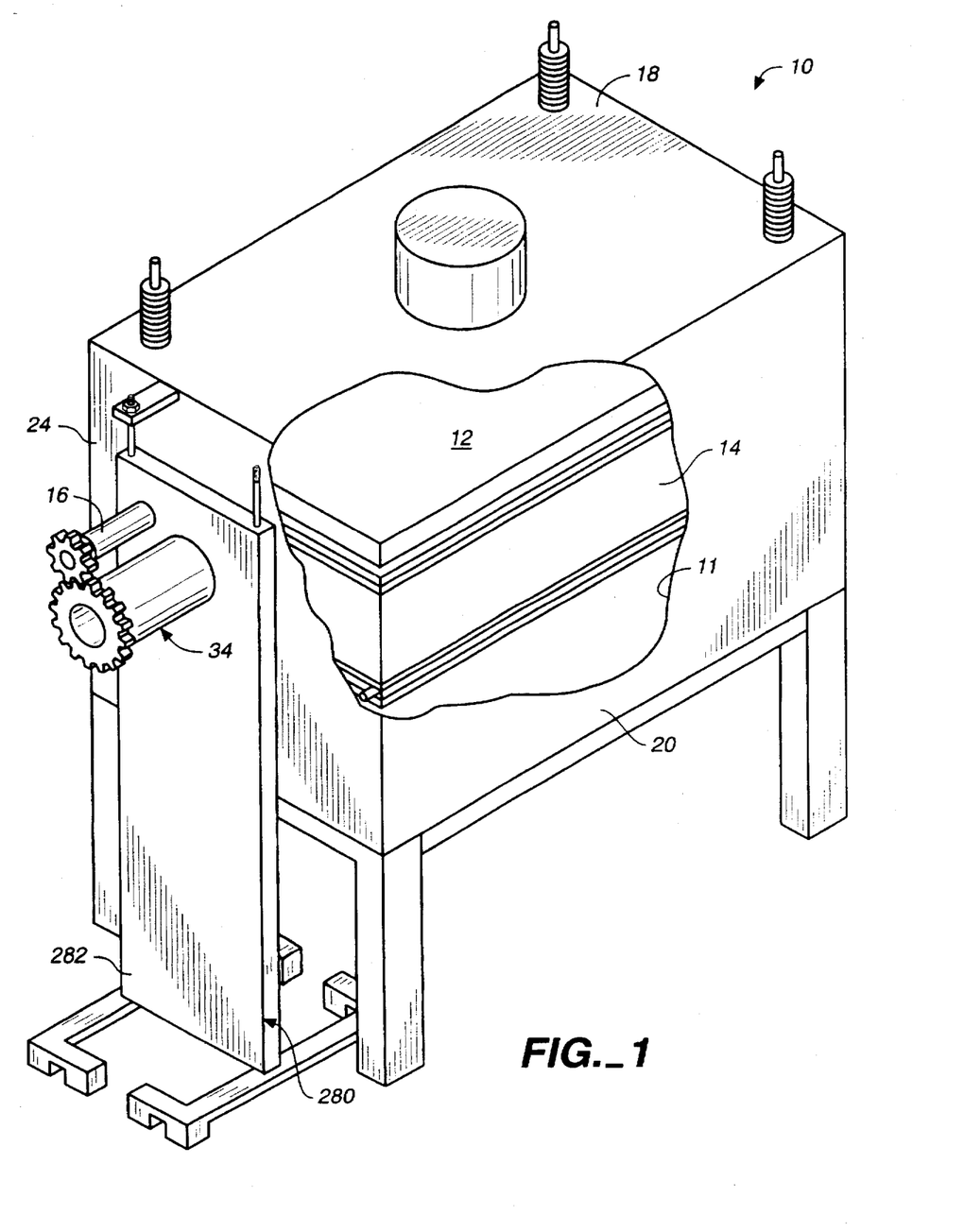
FIG. 1 is a perspective view, partially in section, of the etch chamber and support stand of the present invention with the support member positioned for the loading of substrates into the chamber and unloading of substrates from the chamber.

The present invention provides a chamber configuration for the processing of substrates. In the preferred environment the chamber configuration is as an etch chamber 10, as shown in FIG. 1, for plasma etching the surface of a flat panel display substrate 12 or other substrate, wherein the substrates 12 are maintained in a horizontal plane as they are loaded into, or removed from, the chamber 10, and the substrates 12 are rotated to a horizontal plane for the etch cycle. The chamber 10 is preferably configured as a reactive ion etch chamber, wherein the substrates 12 are received on a support member 14 which is preferably maintained at a negative self-biasing voltage with an R.F. voltage source at approximately 13.5 MHz, which may be capacitively coupled, the chamber 10 is maintained at a vacuum pressure, and an etching gas species is charged into the chamber 10 and sparked into a plasma by the R.F. voltage source.

The Etch Chamber Configuration

Figure 2:
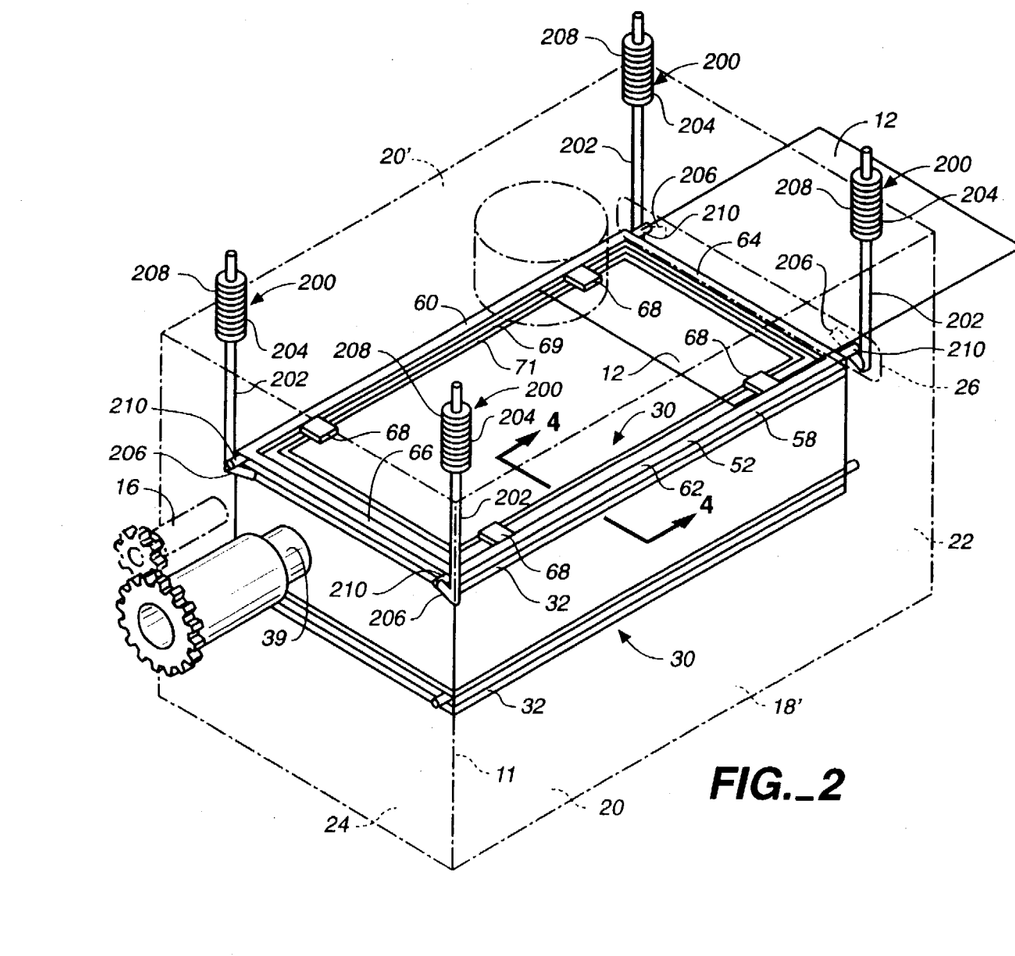
FIG. 2 is a perspective view of the etch chamber of the present invention with the chamber wall shown in phantom to reveal the support member positioned for the loading of substrates into the chamber and unloading of substrates from the chamber.

Referring to FIGS. 1 and 2, the etch chamber 10 of the present invention generally includes an enclosure wall 11 to enclose the support member 14 preferably configured as a cathode, and a support member drive system 16 located exterior of the chamber 10 on a moveable stand 280 (shown in FIG. 1) to rotate the support member 14 within the enclosure wall 11. The enclosure wall 11 includes generally rectangular opposed side wall 20, 20', having opposed first and second end walls 22, 24 (wall 22 shown in FIG. 2), a top 18 and a base 18'. As shown in FIG. 2, a slit valve 26 is provided through the first end wall 22 to provide access to the interior of the chamber 10 to place substrates 12 onto, and remove substrates 12 from, the support member 14. The support member drive system 16 is coupled, through a rotary vacuum coupling through the second end wall 24, to the support member 14 to permit rotation of the support member 14 about a horizontal axis within the chamber 10. The rotary coupling also passes utilities from outside the chamber 10 to within the chamber 10.

Figure 3:
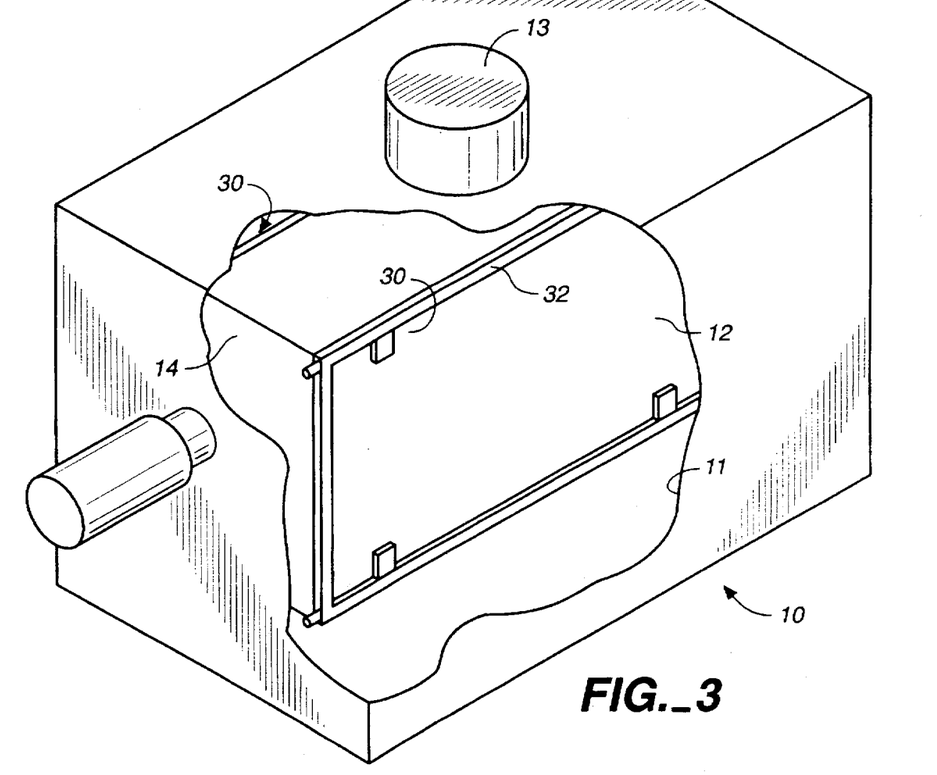
FIG. 3 is a perspective view, partially in section, of the etch chamber of the present invention with the support member positioned in the substrate etch position.

Referring now to FIG. 3, the etch chamber 10 of the present invention is shown in the etch position, wherein the support member 14 has been rotated ninety degrees with respect to its position in the loading position shown in FIG. 2. The chamber 10 is preferably configured as a reactive ion etch chamber, wherein a reactive plasma is provided intermediate the substrate 12 and the electrically grounded enclosure walls 11, to selectively etch the film layer on the exposed surface of the substrate 12. Therefore, the chamber enclosure wall 11 is electrically grounded, and the support member 14 is maintained at a negative voltage with respect to the plasma. An R.F. bias, at a frequency of 13.5 MHz, establishes a negative bias on the support member 14 because the electron mobility in the plasma is much greater than the ion mobility in the plasma. Preferably, the support member 14 is biased at a voltage of between 200 and 600 volts with respect to the chamber walls 11. A conventional gas inlet (not shown) and a conventional chamber outlet (not shown) are provided to allow a gas or gases, having a selective etching affinity for portions of the film layer on the exposed surface of the substrate 12 when in the plasma state, to be maintained at a specified pressure within, and flow rate through, the chamber 10. The gas may be distributed within the chamber 10 through tubes having multiple holes therein, or other conduits. The chamber outlet includes at least one, and preferably two, vacuum pumps 13 (only one shown), such as a turbo-molecular pump to reduce the pressure in the chamber below approximately 200 milli-torr, preferably in the range of 15 to 40 milli-torr with a total gas flow of approximately 40 to 100 sccm. Gas mixtures including chlorine based chemistries, such as $BCl_3$, $Cl_2$, HCl, $CCl_4$ etc. are used to etch silicon, aluminum or reflective metals such as Ti, Ta or Cr. Gas mixtures having fluorine based chemistries are used to etch silicon nitride and $SiO_2$. Mixtures of the chlorine and fluorine based chemistries may be used to etch reflective metals such as Mo, Ta, MoTa, etc. Although the chamber 10 is preferably configured as an etch chamber, the apparatus of the present invention may be used for deposition processes, in particular, plasma deposition and chemical vapor deposition processes, and other etch processes, may be performed in the chamber 10.

The Preferred Substrate Support Member Structure

Figure 6:
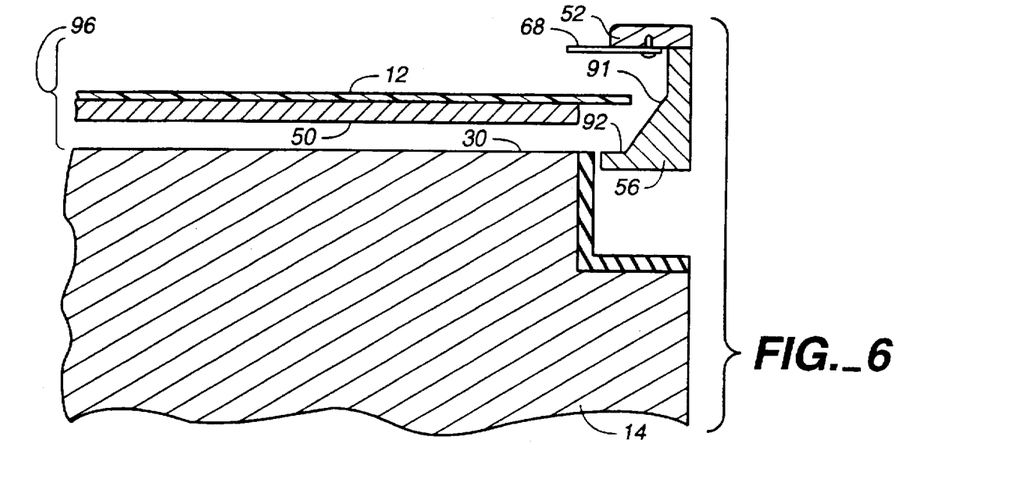
FIG. 6 is a partial sectional view of the support member of FIG. 2 positioned to receive a substrate thereon or remove a substrate therefrom.
Figure 7:
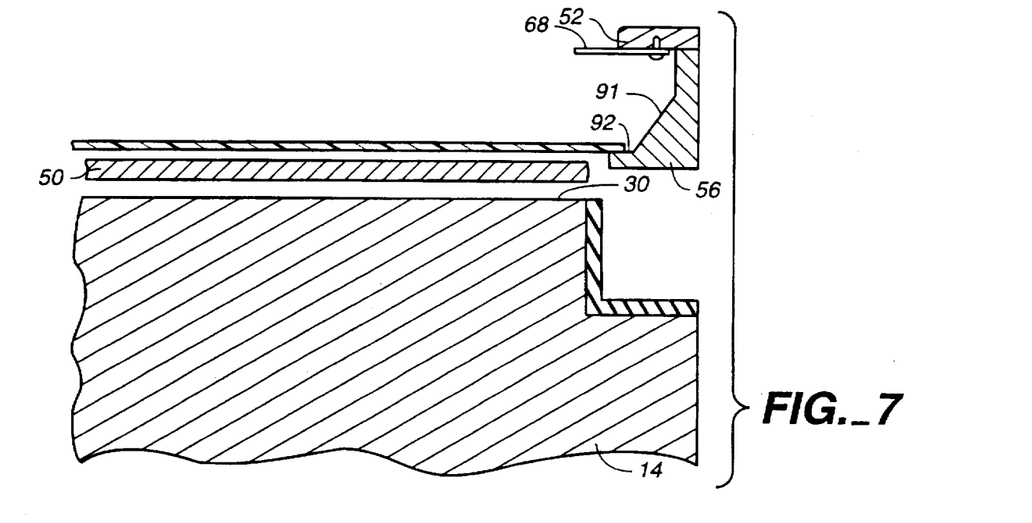
FIG. 7 is a partial sectional view of the support member of FIG. 1 positioned to actuate a robot blade under the substrate.

Referring now to FIGS. 2 and 3, the substrate support member 14 is preferably configured to permit simultaneous processing of multiple substrates 12 in the chamber 10. The support member 16 thus includes a plurality of, preferably two, parallel substrate receiving faces 30 (only one shown in FIGS. 2 and 3) disposed on opposite sides of the support member 14, each of which are sized to receive a single substrate 12 thereon. The support member 14 also includes respective substrate clamp and lift assemblies 32 disposed on each of the substrate receiving faces 30. As will be further described herein, each of the clamp and lift assemblies 32 are selectively positionable at a clamping position wherein they clamp a substrate 12 to the support member 14, and at a loading/unloading position wherein they are positioned above the support member 14 to support the substrate 12 above the substrate receiving face 30 of the support member 14. In the loading/unloading position, a space is provided between the clamp and lift assembly 32 and the substrate receiving faces 30, as shown in FIGS. 6 and 7, to provide access for a robot blade 50 (shown in FIGS. 6 to 8) to place the substrate 12 on the support member 14 or remove the substrate 12 from the support member 14.

The support member 14 is also rotatable, about a horizontal axis, to move the substrate receiving faces 30 of the support member 14 between a horizontal loading position as shown in FIG. 2, and a vertical etching position, as shown in FIG. 3. Therefore, the support member 14 also includes a rotatable coupling 34, which extends from one end of the support member 14 through an aperture in the enclosure second end wall 24, where it terminates in connection with the support member drive member 16. The rotatable coupling 34 is preferably a tubular member, which is received in the support stand 280 disposed on the exterior of the second chamber wall 24 (shown in FIG. 1), as will be further described herein. The rotatable coupling 34 supports the support member 14 in the chamber 10, and also communicates utilities, such as gas, coolant and electrical feed lines into the support member 14 as will be also further described herein. Although the support member is preferably cantilevered from the end wall 24, the support member may be supported off both end walls 22, 24.

The Substrate Clamp Assembly

Figure 4:
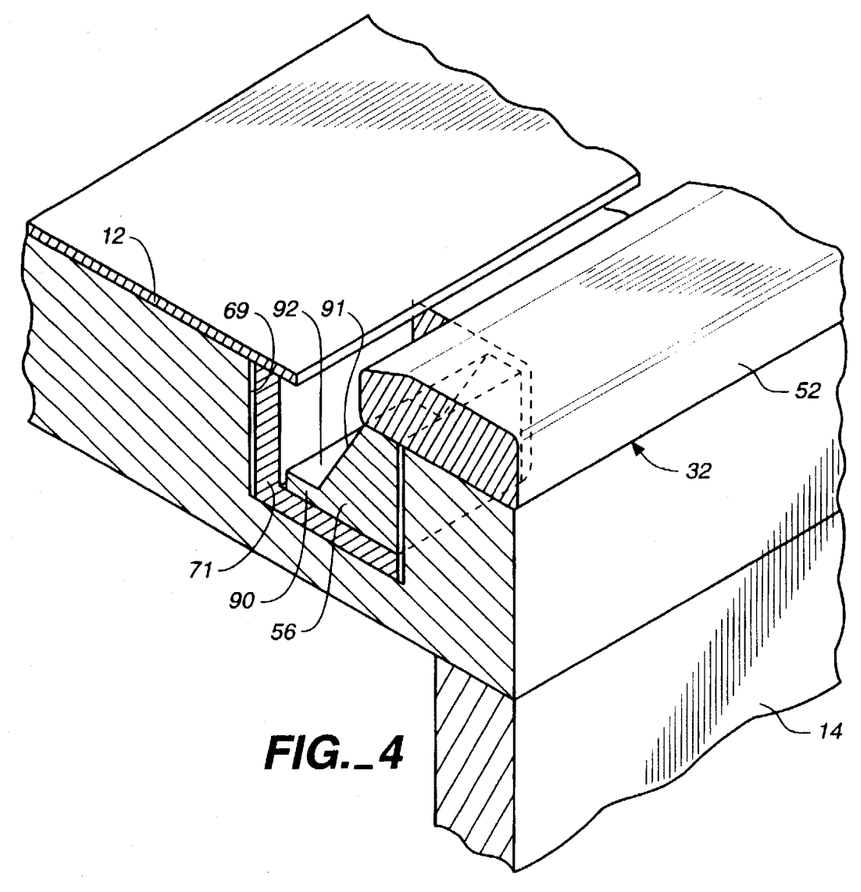
FIG. 4 is a partial perspective view, partially in section, of the support member of FIG. 2 at 4—4.
Figure 5:
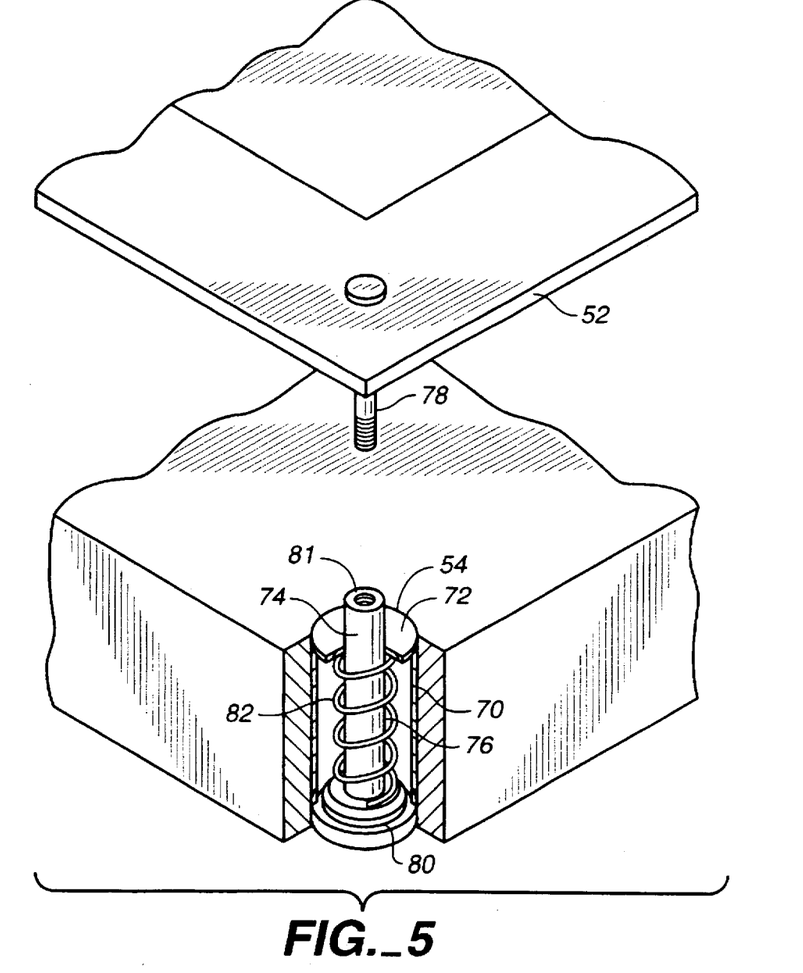
FIG. 5 is a partial perspective view, partially in section, of the clamp biasing member of the support member of FIG. 2.

Referring now to FIGS. 2, 4 and 5, the details of the substrate clamp and lift assemblies 32 are shown. A clamp and lift assembly 32 is received on each of the substrate support faces 30 of the support member 14, and therefore only one of the substrate clamp and lift assembly 32 will be described in detail. The substrate clamp and lift assembly 32 includes an annular clamp ring 52 sized to be received about the perimeter of the substrate receiving face 30 of the support member 14, such that a substrate 12, when received on the substrate receiving face 30, is received within the envelope of the substrate clamp and lift assembly 32. The clamp and lift assembly 32 also includes a plurality of clamp biasing members 54 (shown in FIG. 5) disposed intermediate of the clamp ring 52 and the cathode 16, and a plurality of substrate lift members 56 (as shown in FIG. 4) disposed about the perimeter of the clamp ring 52. Where the substrate 12 is a rectangle, the clamp ring 52 is likewise an annular rectangle.

Referring to FIG. 2, the clamp ring 52 includes a plurality of individual rail members 58, including opposed first side rail members 60, 62 perpendicularly connected to opposed second side rail members 64, 66, to form the rectangular profile. A plurality of clamp fingers 68, preferably ceramic, extend inwardly from the first side rail members 60, 62 by a distance sufficient to engage over the top, exposed surface of a substrate 12 received on the substrate receiving face 30 of the support member 14. The clamp fingers 68 are preferably adjustable longitudinally along the rail members 60, 62, to allow the clamp 52 to clamp substrates 12 of different lengths to the support member 14. The fingers 68 may be adjusted by providing a plurality of threaded holes (not shown) in the clamp rails 60, 62, and affixing the fingers 68 to selective ones of the threaded holes with a fastener such as a bolt. The clamping ends of the clamp fingers 68 are preferably sized to fit only slightly inwardly of the edge of a substrate 12 received on the substrate receiving face 30 of the support member, to minimize shadowing on the substrate 12.

The clamp ring 52 is preferably manufactured from an insulative material, although conductive materials may also be used. To limit any electric conductance from the clamp ring 52 to the substrate 12, the clamp fingers 68 are preferably manufactured from an insulative material, such as ceramic, and the support member includes a annular channel 69 therein, which extends about the perimeter of the substrate receiving face and receives an insulative member 71 therein, formed from a material such as ceramic, to form an insulating barrier between the clamp ring 52 and the substrate 12 (best shown in FIG. 4).

The Structure and Operation of the Clamp Biasing Members

The clamp ring 52 is connected to, and spring biasable toward, the support member 14 by a plurality of the clamp biasing members 54 as shown in FIG. 5. Preferably, a clamp biasing member is located at each corner of the clamp ring 52. Each of the clamp biasing members 54 include a housing 70 extending inwardly of the support member 14 and terminating at the surface of the support member 14 in an upper flange 72, and a spring loaded pin 74 extending within the housing 70 and terminating outwardly of the housing 70 adjacent to the flange 72. The spring loaded pin 74 includes a shaft portion 76, which is received on a piston member 80 located within the housing 70, and an extending portion 81 formed as an extension of the shaft portion 76 extending outwardly of the support member 14 through the upper flange 72. A spring 82 extends within the housing 70 between the flange 72 and the piston member 80, to bias the piston member 80, and thus the shaft portion 76, inwardly of the housing 70. The extending portion 81 of the spring loaded pin 74 is connected to the clamp ring 52. Preferably, the extending portion 81 of the pin 74 includes an internal threaded bore, and a bolt 78 extends through the clamp ring 52 and into the threaded bore to secure the clamp ring 52 to the clamp biasing member 54. Thus, the clamp ring 52 may be readily removed from the support member for servicing, by simply removing the bolts 78 (only one shown) which secure the clamp ring to the clamp biasing members 54.

The clamp biasing members 54 bias the clamp ring 52, and thus the clamp fingers 68 extending from the clamp ring 52 over the substrate 12, toward the support member 14. Thus, the clamp biasing members 54 are used to maintain the clamp fingers 68 in contact with the substrate 12, and thus the substrate 12 in contact with the support member 14, throughout the etch process. The springs 82 in the biasing members 54 must maintain sufficient force on the substrate 12 to maintain contact between the substrate 12 and the support member 14 as the support member 14 is rotated in the chamber. With a 550 mm by 650 mm glass substrate 12, using four clamp biasing members 54 to secure the substrate 12 to the support member 14, a spring force of approximately $0.13 N/cm^2$ is sufficient to maintain the substrate 12 on the support member 14 as the support member 14 is rotated in the chamber 10. However, to ensure that the substrate 12 is maintained on the support members, the springs 82 may be variable force springs, such that the spring force increases when the springs 84 are compressed, which occurs when the clamp ring 52 is moves away from the adjacent face of the support member 14.

The Substrate Lifting Apparatus

Referring now to FIG. 4, the clamp ring 52 further includes a plurality of the substrate lift members 56 (only one shown) extending from the clamp ring 52 to a position intermediate the substrate 12 and the support member body 14. One lift member 56 is preferably provided on the underside of each end of the opposed first rail members 60, 62 of the clamp ring 52, and a groove, or recess, is provided in the annular insulative member 71 to allow the lift member 56 to be recessed into the support member 14 when the clamp ring 52 is positioned to clamp the substrate 12 to the support member 14. Lift members 56 may also be located in the end rail 66 disposed opposite to the position of the slit valve 26. Each lift member 56 includes an offset lip portion 90 which extends inwardly of the clamp ring 52 in a parallel offset relation to the generally planar underside of the first clamp side rail members 60, 62, and a centering member 91 which extends at an oblique angle to the upper surface of the lip portion 90, intermediate of the lip portion 90 and the clamp rails 60, 62. The lip portion 90 includes a generally planar upper substrate engaging face 92, which is moveable with respect to the substrate 12, to lift the substrate from the support member 14 as will be further described herein.

The Operation of the Clamp and Lift Assembly

Figure 8:
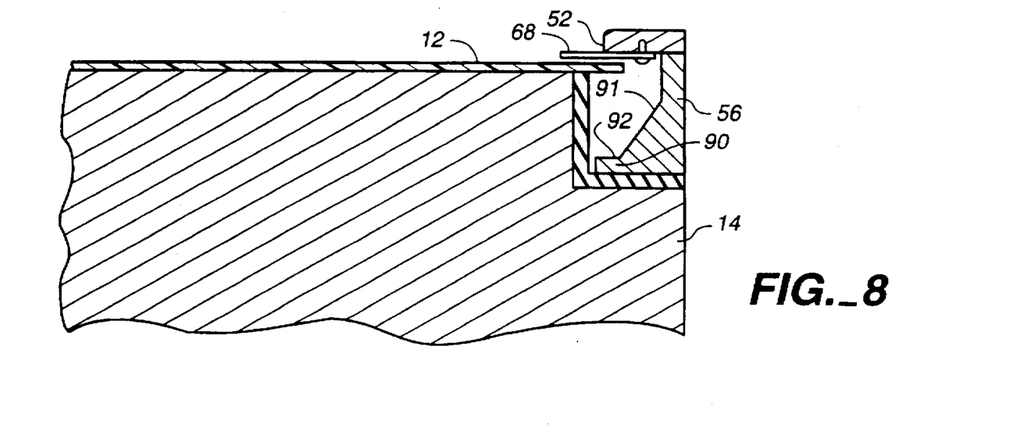
FIG. 8 is a partial sectional view of the support member of FIG. 1 positioned to clamp a substrate thereon for etching in the chamber.

Referring now to FIGS. 6, 7 and 8, the clamp and lift assembly 32 is configured to interact with a robot blade 50 (shown in FIGS. 6 and 7), to remove the substrate from the robot blade 50 and then position and clamp the substrate 12 on the support member 14, and to lift the substrate 12 from the support member to position the substrate 12 to be removed from the chamber 10 by the robot blade 50. To prepare for the loading of a substrate 12 onto the support member 14, the clamp ring 52 is actuated away from the support member 14 to the position shown in FIG. 6. In this position, the clamp fingers 68 are spaced from the substrate receiving face 30 of the support member 14, but the substrate engaging surface 92 of the lifters 56 remains recessed at or below the substrate receiving face 30 of the support member 14. Thus, a substrate insertion gap 96 is supplied between the support member 14 and the fingers 68, and this gap 96 is of sufficient size to allow a substrate 12, and a robot blade 50 supporting the substrate 12, to be inserted horizontally between the support member 14 and the clamp fingers 68 on the underside of the clamp ring 52.

Once the robot blade 50 positions the substrate 12 between the support member 14 and the partially raised clamp ring 52, the clamp ring 52 is actuated further outwardly from the support member 14 as shown in FIG. 7, to engage with the underside of the substrate 12 the substrate receiving surfaces 92 of the lift members 56 and then lift the substrate 12 off the robot blade 50. If the substrate 12 is misaligned with respect to the substrate receiving face 30, the centering face 91 of one or more lift members 56 will engage the edge of the substrate 12 and move it inwardly of the adjacent clamp rail 60 or 62 to align the substrate 12 for receipt on the substrate receiving face 30 of the support member 14. Once the substrate 12 is supported in the chamber 10 by the lift members 56, the robot blade 50 may be retracted from the chamber 10 through the slit valve 26.

To position the substrate 12 on the support member 14, the clamp ring 52 is moved in the direction of the substrate receiving face 30 of the support member 14 to the position shown in FIG. 8. The clamp ring 52 preferably moves from the fully extended position shown in FIG. 7 to the clamping position in FIG. 8 at a continuous, relatively slow speed to ensure that the substrate 12 is not chipped or cracked by the engagement of the substrate 12 against the support member 14 or of the fingers 68 against the substrate 12. However, the clamp ring 52 motion may occur in discrete, or continuous, multiple speed steps, to reduce the time needed to clamp the substrate 12 to the support member 14. To remove a substrate 12 from the chamber, the sequence of movements of the clamp ring 52 are reversed.

The placement of the substrate 12 on and off the support member 14 requires complete clearance of the robot blade 50 and substrate 12 as they are actuated inwardly and outwardly of the chamber 10. If the substrate 12 or the robot blade 50 touches the clamp and lift assembly 32 or the support member 14 as they are moving inwardly or outwardly of the chamber, contaminating particles will be generated by the movement of these part surfaces on each other, or worse, the substrate 12 can be chipped, cracked or otherwise damaged. Thus, the clearance between the substrate receiving face 30 of the support member and the clamp fingers 68 must be sufficient to permit the robot blade and substrate 12 to pass between the fingers 68 and the substrate receiving face 30 without touching either component. Then, only after the substrate 12 has stopped moving with respect to the support member 14, may the clamp and lift assembly 32 be operated to lift the substrate off the robot blade.

The Clamp Actuator Structure

The movement of the clamp ring 52 between the clamping position and the extended position is preferably actuated with four actuating members 200 which, as shown in FIG. 2, are mounted on the top enclosure wall 11. By locating the actuating members 200 on the enclosure wall 11, each of the clamp rings 52 may be positioned adjacent to the actuating members 200 by rotating the support member 14 to position the clamp ring 52 adjacent the actuator members 200.

The clamp actuators 200 move the clamp ring 52 between the positions shown in FIGS. 6, 7 and 8. In the preferred embodiment, the clamp actuators 200 are inwardly extendable from the top enclosure wall 11 of the chamber 10 to selectively engage the clamp ring 52, and is outwardly retractable into the enclosure wall 11 during substrate 12 etching to prevent, or minimize, etching of the actuator 200. As best shown in FIG. 2, the actuators 200, preferably four in number, each include a rod 202 which extends through an aperture 204 in the enclosure wall 11 of the chamber 10 and terminate inwardly of the chamber 10 in a hook portion 206. The rods 202 are linearly actuable inwardly and outwardly of the chamber 10, and are rotatable about their longitudinal axis. A bellows 208 is provided on the exterior of the enclosure wall 11 about each of the apertures 204 in the enclosure wall 11. The outermost end of the bellows 208 is sealingly engaged to the rod 202, such as with a lip seal, to seal the aperture 204 through the enclosure wall 11.

Preferably, one actuator 200 is provided to lift each corner of the clamp ring 52. Thus, where the substrate 12, and thus the clamp ring 52, are rectangular, four actuators 200 are provided. To move the clamp ring 52 between the positions shown in FIGS. 6 to 8, the rod 202 of each actuator 200 is first actuated from a fully retracted position from the chamber 10 to a position, as shown by phantom lines in FIG. 2, wherein the hook 206 is disposed immediately adjacent, and below, the clamp ring 52. The rod 202 is then rotated to place the hook 206 immediately below the edge of the clamp ring 52. Then, all four rods 202, with the hooks 206 thereof placed underneath the clamp ring 52, are simultaneously retracted through the enclosure wall to lift the clamp ring 52 from the support member 14. The rods 202 simultaneously move to position the clamp ring 52 in the positions shown in FIGS. 6, 7 and 8, to permit loading and unloading of the substrate 12 on the support member 14.

The placement of the hooks 206 under the clamp ring 52, followed by retraction of the rod 202 through the aperture 204, is sufficient to link the clamp ring 52 to the clamp actuators 200 to move the clamp ring 52 between the substrate loading and clamping positions. However, in the preferred embodiment, the clamp ring 52 includes, at each corner thereof, an outwardly extending lifting rods 210. Thus, as the hook 206 is moved upwardly from a position below the clamp ring 52 to lift the clamp ring 52 from the support member 14, the end of the rod 210 is received on the hooks 206 which causes the hook 206 to align itself with the lifting rod 210.

The clamp actuators 200 are located in the chamber 10 to load the substrate 12 on each substrate receiving face 30 of the support member 14. For example, where the support member 14 has two substrate receiving faces 30, a substrate 12 is loaded onto one of the substrate receiving surfaces 30, and the support member 14 is then rotated 180º to locate the other substrate receiving surface 30 adjacent the clamp actuators 200. The actuators 200 move the clamp ring 52 on this second substrate receiving surface 30 to position the substrate 12 on the support member 14 for processing.

The Internal Structure of the Support Member

Figure 9:
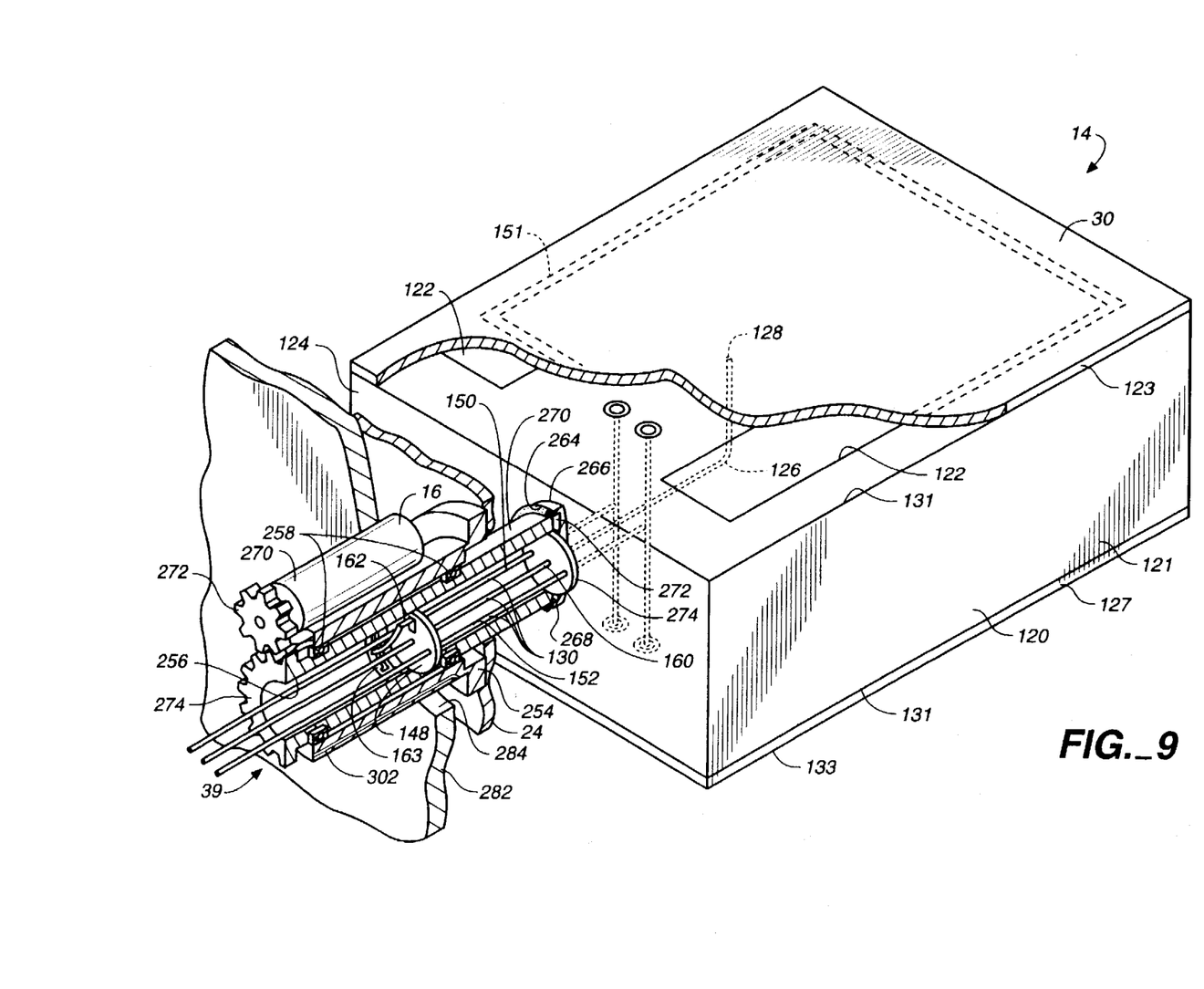
FIG. 9 is a perspective view, partially in section, of the support member of FIG. 1.

Referring now to FIG. 9, the internal structure of the support member 14 is shown. The support member 14 includes a metallic body 120 having a central core portion 121 and opposed plates 123, 127 received on the core portion 121 and forming thee mounting faces 30. The core portion 121 includes a plurality of cutaway portions 122 separated by webs, parallel planar mounting faces 131 on which the plates 123, 127 are affixed, and at least one planar mounted side face 124 perpendicular to the planar mounting faces 131, 133. The rotatable coupling 34 is connected, preferably through an insulated flange connection 264, to the support member at the planar mounting face 124. The cutaway portions 122 of the support member 14 are provided to reduce the weight of the support member 14 to reduce the bending moment on the rotatable coupling 34 and related support structures. The cutaway portions 122 are preferably filled with a light weight plastic insulative material.

The Substrate Cooling Configuration of the Support Member

Figure 10:
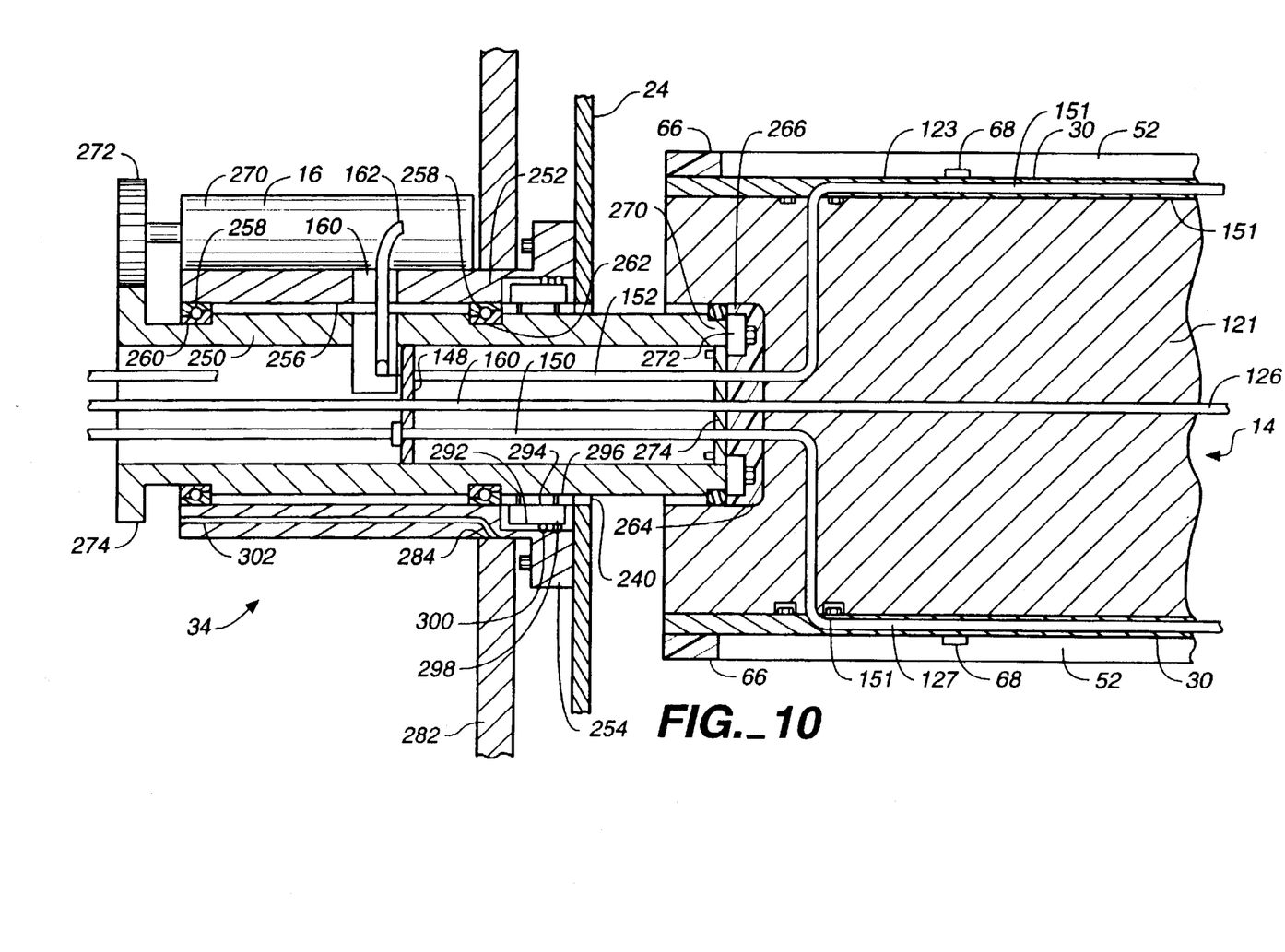
FIG. 10 is a partial sectional view of the connection of the stem, support member and moveable stand of the present invention.

Referring to FIGS. 9 and 10, the structure of the support member 14 for cooling the support member 14 is shown. To cool the substrate received on the plates 123, 127 forming the substrate receiving faces 30 of the support member 14, the plates 123, 127 each include a plurality of flow passages 151 therein (shown in phantom in FIG. 9), through which a coolant, such as water, is flowed throughout the etch process. To supply the coolant into the plates 123, 127, and thus into the coolant passages, a cooling inlet passage extends through the central core portion 121 of the support member 14 and aligns with the inlet to the flow passages 151 in each of the plates 123, 127. An outlet passage likewise extends through the central core portion 121 and aligns with the outlet to the flow passages 151 in each of the plates 123, 127. An o-ring seal is provided adjacent each of the inlets and outlets to the plates 123, 127 seal the connection between the plates 123, 127 and the central core 121. The flow rate and input temperature of the coolant are selected to maintain the substrate 12 temperature within a range that is not detrimental to the devices being formed thereon. It should be appreciated that the cooling of the support member 14 will increase the heat transfer from the substrates 12, but that the temperature of the substrate 12 is still primarily dependant upon the power level in the chamber unless backside cooling of the substrate is maintained. Therefore, a molecular backside cooling passage 126 may be disposed through the support member body, from the stem receiving face of the support member 14, to communicate a gas to ports 128 (only one shown) extending through the approximate centers of the plates 123, 127. The gas provides a heat transfer mechanism for convectively communicating heat from the substrate to the water cooled support member body 120 to cool the substrate 12 during etching of the film layer. Preferably, the gas is allowed to flow between the substrate 12 and the plate 123 or 127, and then into the chamber 10 and the plates 123, 127 may include a plurality of grooves therein the channel the gas along the underside of the substrate 12. By constantly flowing the backside gas, the substrate 12 may be cooled by heat transfer into the support member 14, but pressure does not build between the substrate 12 and the support member 14 which would bend, and possibly break, the substrate 12. The gas may be a non-reactive species, one or more reactive etching species, or a combination of both.

The Stem and Support Utilities Member Connection

The rotatable coupling 34 provides a passageway from the exterior of the chamber 10 enclosure to the interior of the support member, to supply utilities, including the gas, water and electric power, to the support member. To supply the member 14, a water member 14, a water inlet line 150 and a water outlet line 152 extend through the rotatable coupling 34, and are connected to fittings in the stem receiving wall of the support member 14. These fittings form the outer end of the cooling passages in the support member, and thus water or other coolant passed through the inlet will pass through the support member and out the outlet line 152 to remove heat from the support member 14. Each of the water inlet line 150 and water outlet line 152 is preferably configured from a conductive tubing such as copper. Although one water inlet 150 line and one water outlet line 152 are shown and described, multiple inlets and/or multiple outlets are specifically contemplated. A backside cooling passage 160, likewise made of conductive tubing such as copper, also extends though the rotatable coupling 34, to supply the cooling gas to the gas inlet 126. Each of the conductive gas line 160, water inlet line 150 and water outlet line 152 preferably extend from the support member and terminate in an electrically conductive support plate 148 located within the rotatable coupling, and non-conductive tubing extends from the terminus of the lines 150, 152 and 160 at the support plate 148 to the respective utility sources or disposal lines.

The R.F. voltage is preferably supplied to the support member 14 through a hard wire connection, such as a plurality of copper strips 130 brazed to the coolant inlet and outlet lines 150, 152 and the gas feed line. To provide the electric path to the coolant lines 150, 152 and the gas line 160, a strap 162 extends from a R.F. source to the support plate 148. Preferably, the strap 162 extends outwardly of the rotatable coupling 34, through an aperture 163 therethrough, to be connected to a R.F. supply located directly adjacent the rotatable coupling 34. Thus, when the support member is rotated, the strap simply wraps around the coolant lines 150, 152 and the gas line 160. By rotating the support member back and forth to position the substrate receiving faces 30 of the support member 14 in position to receive substrates 12, the strap 162 will not become bound up in the rotatable coupling 34.

The Support Member Support Structure

Referring now to FIG. 10, the details of construction of the rotatable coupling 34 for supporting and rotating the support member 14 within the chamber 10 are shown. Preferably, the rotatable coupling includes a tubular inner stem portion 250 that extends through the chamber second end wall 24 and is connected to the support member 14 within the chamber 10, and an outer cylindrical housing 252 through which the inner stem portion 250 extends. The outer tubular housing 252 includes an annular flange 254 which is connected to the end wall 24 of the chamber to support the outer tubular housing 252 in position on the second end wall 24. Additionally, the inner circumferential surface 256 of the outer housing 252 includes at least two cylindrical bearing pilots 258 therein. The tubular inner stem portion 250 likewise includes a pair of bearing pilots 260 thereon. Roller bearings 262 are provided, and piloted onto the respective pilots 258, 260 of the stem 250 and the outer housing 252, to permit the stem portion 250 to be rotated with respect to the outer housing 252.

The connection of the stem portion 250 to the support member 14 must be an insulative connection 264, so that the stem 250, which extends outwardly of the chamber enclosure, can be maintained at electrical ground whereas the support member 14 may be maintained at a negative voltage for etching. To provide this insulative connection 264, the support member 14 includes a generally annular clamping portion 266 that extends inwardly from the end face 124 of the support member 14, and is larger in diameter than the outer diameter of the stem 250. A first insulative ring 268 is located intermediate the inner terminus 270 of the stem portion 250 and the inner surface of the clamping portion 266, and a first keeper ring 272 is affixed over the inner terminus 270 of the stem 250 to maintain the insulative ring 268 in position. A secondary insulative ring 274 is disposed intermediate of the first keeper ring 272 and the support member central core 121, to maintain the first keeper ring 272 and the stem 250 in electric isolation from the support member 14. A second keeper ring 276 is also received over the first insulative ring 270, on the opposite side of the first insulative ring 270 from the first keeper ring 272, and this second keeper ring 276 is affixed to the clamping portion 266. This locks the inner end 270 of the stem portion 250 to the support member 14, which provides a structurally stable, insulated connection between the stem 250 and the support member 14.

To rotate the stem portion 250 within the outer housing 252, the drive member 16 is coupled to the end of the stem portion 250 that extends outwardly of the chamber 10 and of the outer housing 252. The drive member 16 is preferably mounted to the exterior of the outer housing 252, and it preferably includes a motor 270 linked by a geared output shaft 272 to a ring gear 274 on the exterior of the stem portion 250. The motor 270 is preferably a precision positioning motor, such as a stepper motor, that can rotate the support member in distinct arcuate steps. Limit switches (not shown), or other positioning members, can be used to determine the position of the support member 14 within the chamber 10, and their output can be monitored by a controller to derive and send inputs to the motor 270 to control the rotational position of the support member in the chamber 10.

The support member 14 must be precisely positioned in the chamber 10, with respect to the slit valve 26 (shown in FIG. 2) and the robot blade (shown in FIGS. 6 and 7), to ensure that the substrate 12 is properly received on the support member 14. Additionally, the support member 14 may need to serviced, and therefore the support member 14 must be readily accessible to service technicians. To provide these features, the end wall 24 of the chamber 10, with the rotatable coupling 34 and the support member 14 attached thereto, are configured to be removed from the chamber. Referring to FIGS. 1 and 10, the rotatable coupling 34 is received in a moveable stand 280 (shown in FIG. 1), which includes a generally planar upright portion 282. The upright portion 282 includes a bore 284 therethrough, into which the outer housing 252 of the rotatable coupling 34 is piloted. Preferably, the outer housing 252 is positioned within the upright portion 282 such that the moment of the components on one side of the upright 282 is closely matched by the mass of the components on the other side of the upright 282 to reduce any bending moment where the rotatable coupling 34 extends through the upright 282 and at the position where the outer housing 252 of the rotatable housing 34 attaches to the second end wall 24.

Referring now to FIG. 1, to vertically align the support member 14 with the slit valve, the upper end of the upright portion 282 includes a pair of threaded adjustment rod 286 extending upwardly therefrom, which are adjustably receivable within hangers 288 (only one shown) extending from the chamber end wall 24. By turning a nut, or other fastener, on the hanger 288 on the threaded adjustment rod 286, the position of the upright portion 282 may be adjusted upwardly or downwardly with respect to the chamber top 18 to adjust the alignment of the support member 14 with the slit valve 26, such alignment being shown in FIG. 2. Secondary bolts 285 (only one shown) may by used to further attach the second end wall 24 with the upright 282. Additionally, for servicing of the interior of the chamber 10 or of the support member, the chamber end wall 24 may be detached from the chamber base 18', top 18 and side walls 20 and 20', and the moveable stand 280 may be moved away from the chamber 10. The upright portion 282 supports the second chamber end wall 24, with the rotatable coupling 34 and the support member 14 thereon, as they are pulled from the chamber.

The extension of the stem portion 250 through the chamber end wall 24 must be sealed to prevent leakage of air, which may include particulate contaminants, into the chamber 10. Referring again to FIG. 10, an aperture 290 is provided through the chamber end wall 24, within the envelope of the flange 254 by which the rotatable coupling 34 is connected to the second end wall 24. A seal support ring 292 is disposed about the outer surface of the stem portion 250, intermediate of the inboard roller bearing 262 and the second end wall 24. A pair of lip seals 294, 296 are located in seal grooves in the support ring 292, to seal the interface of the inner diameter of the support ring 292 and the outer diameter of the stem portion 250, and o-ring seals 298 are located in a groove in the outer diameter of the support ring 292 to seal the interface of the support ring with the inner diameter of the outer housing 252. A gas port 302 may be provided to the space between the two lip seals 294, 296, to supply gas into the space between the lip seals 294, 296 to prevent leakage past the lip seals 294, 296.

Operation of the Chamber as an Etch Chamber

To operate the chamber 10, the motor 270 is first actuated to rotate one of the substrate receiving faces 30 of the support member 14 in horizontal alignment with the slit valve 26. The slit valve is opened, and a substrate 12 is loaded, and clamped, on the support member 14 as described infra. The support member 14 is then rotated 180 degrees to position the other substrate receiving face 30 of the support member 14 with respect to the slit valve 26. A substrate 12 is then loaded, and clamped, on the other substrate receiving face 30 of the support member as described infra. The support member is then rotated 90 degrees, to position the substrates 12 in a vertical position for processing. Although the substrates 12 are preferably positioned at 90 degrees to vertical during etching, the present invention specifically contemplates placing the substrates 12 at angles as small as 75 degrees from vertical during etching, i.e., the lower edge of the substrate 12 is closer to the vertical end wall 20 ar 20' of the chamber 10 than the upper edge of the substrate 12. This may easily be accomplished by providing the two substrate receiving surfaces 30 of the support member 14 in a non-parallel relationship, so that the support member 14, when positioned for etching, positions the substrates 12 at an angle of 75 degrees to vertical. Gases, selected to give desired etching of the film layer on the substrates 12 when in a plasma state, are pumped into the chamber while the R.F. voltage is applied to the support member 14. An etch plasma is thus sparked in the chamber to etch the film layer on substrate 12.

By maintaining a high voltage on the order of 200 to 600 volts between the substrates 12 and the electrically grounded chamber walls, but simultaneously maintaining a relatively low power density of 0.25 to 1.25 w/cm$^2$, the substrate 12 may be etched in a chlorine based chemistry with without exceeding the thermal breakdown point of the resist and while forming tapered walls on the etched areas of the substrate 12.

The support member 14 is preferably rotated no more than approximately 200 degrees, and preferably no more than 180 degrees, to load, process and unload the substrate 12. Thus, for example, the support member 14 is rotated 180 degrees in a counterclockwise direction after the first substrate 12 is loaded on the support member 14 to position the support member 14 for loading the second substrate 12 thereon, and then rotated 90 degrees clockwise for processing of the substrates 12 after the second substrate 12 is loaded on the support member 14. Then, to unload the substrates 12, the support member 14 is rotated counter clockwise by 90 degrees to position the second substrate 12 for removal, and then rotated clockwise by 180 degrees for removal of the first substrate 12 and loading of a new substrate 12 onto the support member 14. By rotating the support member 14 no more than 200 degrees, the feed lines for the coolant and gas supplies will not become tangled, and a simple strap 162 may be used to supply the R.F. electric path.

The apparatus of the present invention is particularly useful for the processing of large flat panel displays, and other large members, particularly in etch applications where the heat transfer rate from the substrate 12 and into the support member 14 limits the maximum power density of the plasma. Using the chamber 10 of the present invention, two substrates 12 may be simultaneously processed, at the same 0.25 to 1.25 w/cm$^2$ power density as the prior art, to double the throughput of substrates 12 through a chamber 10 at the same power density previously used to process only one substrate 12. Additionally, by flowing a gas between the substrate 12 and the support member 14, the power density may be increased to further increase the etch rate, and thus the throughput of substrates 12 through the chamber 10.

We claims:

1. A method of positioning substrates on, and clamping substrates to, a first substrate receiving surface disposed within a chamber having an enclosure wall and an access aperture through the enclosure wall, comprising:

providing a lift member selectively positionable with respect to the substrate receiving surface;

providing a clamp finger selectively positionable with respect to the substrate receiving surface;

coupling the lift member and the clamp finger with a clamp ring;

spacing the lift member and the clamp finger by a gap sufficient to place a substrate and a substrate positioning blade intermediate the lift member and the clamp finger;

positioning the clamp ring in a first position, wherein the clamp finger is spaced from the first substrate receiving surface and placing a substrate, on a support blade, intermediate the first substrate receiving surface and the clamp finger;

moving the clamp ring away from the first substrate receiving surface to lift the substrate from the support blade;

retracting the support blade from the chamber; and moving the clamp ring to position the substrate on the first substrate receiving surface and place the clamp finger in engagement with the substrate.

2. The method of claim 1, further including the step of:

providing a bias member to bias the clamp ring toward the first substrate receiving surface.

3. The method of claim 1, further including the step of providing an actuation member extendable from the enclosure wal to the lift to selectively position the lift member with respect to the first substrate receiving surface.

4. The method of claim 1, further including the steps of:

providing a cathode within the chamber wherein the first substrate receiving surface is located on the cathode;

providing a second substrate receiving surface on the cathode parallel to the first substrate receiving surface;

rotating the cathode to align the second substrate receiving surface with the aperture; and positioning a second substrate on the second substrate receiving surface.

5. The method of claim 1, wherein the chamber is a reactive ion etch chamber.

6. A method of processing substrates in a chamber, comprising:

providing a support member, having at least first and second substrate receiving faces, in the chamber;

aligning the first substrate receiving face with a slit valve and loading a substrate through the slit valve and onto the first substrate receiving face; and rotating the support member to align the second substrate receiving face with the slit valve and loading another substrate through the slit valve and onto the second substrate receiving face.

7. The method of claim 6, further including the step of rotating the support member to position the substrates for processing in a position other than the position at which they were loaded into the chamber.

8. The method of claim 7, wherein the substrates are positioned vertically for processing.

9. The method of claim 7, wherein the substrates are positioned at least 75 degrees from horizontal for processing.

10. The method of claim 6, further including the step of providing a clamp ring on at least the first substrate receiving face.

11. The method of claim 10, further including the steps of:

providing at least two lift members on the clamp ring;

lifting the clamp ring from the first substrate receiving face when the substrate is being loaded thereon;

lifting the substrate from a robot blade; and then moving the clamp ring into position on the first substrate receiving face, such that the substrate is received on the first substrate receiving face and the clamp ring clamps the substrate against the support member.

12. The method of claim 11, further including the steps of:

providing a clamp actuator extendable between a retracted position and an extended position;

extending the actuator to a position adjacent the clamp ring;

lifting the clamp ring with the actuator to move the clamp ring away from the first substrate receiving face to allow the substrate to be inserted between the first substrate receiving face and the clamp ring;

lowering the actuator and the clamp ring to position the clamp ring to clamp the substrate to the support member; and retracting the actuator.

13. The method of claim 12, further including the steps of:

forming the actuator from a plurality of rods terminating in hooks; and rotating the rods to place the hooks below a surface of the clamp ring prior to lifting the clamp ring with the actuator.

14. An apparatus for etching film layers on substrates, comprising:

an enclosure;

a substrate support member within said enclosure;

said substrate support member including a plurality of substantially planar substrate receiving surfaces;

said substrate support member positionable in a first position wherein at least one of said substrate receiving surfaces is disposed in a horizontal position to receive a substrate thereon and further positionable in a second position, different than said first position, for etching a film layer on the substrate; and a clamp member selectively positionable with respect to said at least one substrate receiving surface to engage the substrate.

15. The apparatus of claim 14, wherein said clamp member includes at least one clamp finger.

16. The apparatus of claim 15, wherein said clamp member further includes at least one clamp lift member.

17. The apparatus of claim 16, wherein said clamp lift member is positionable in a first position in which said clamp finger is engaged against the substrate to clamp the substrate to said at least one substrate receiving surface.

18. The apparatus of claim 17, wherein said clamp lift member is further positionable in a second position in which said clamp lift member supports the substrate above said substrate support member.

19. The apparatus of claim 16, wherein said clamp member further includes a clamp ring, wherein said clamp lift member and said clamp finger are connected to said clamp ring.

20. The apparatus of claim 19, further including a clamp biasing member disposed intermediate said clamp ring and said substrate support member.

21. The apparatus of claim 20, wherein said clamp biasing member includes a spring loaded stem extending outwardly from said substrate support member.

22. The apparatus of claim 21, further including a clamp actuator to move said clamp member between a first position in which said clamp finder is engaged against the substrate to clamp the substrate to said at least one substrate receiving surface and a second position in which said clamp lift member supports the substrate above said substrate support member.

23. The apparatus of claim 22, wherein said clamp actuator includes a plurality of rods extending through said enclosure.

24. The apparatus of claim 23, wherein said rods further include a hook portion selectively engageable with said clamp member.

25. The apparatus of claim 24, wherein:

said clamp ring includes at least one extending portion thereon; and said hook portion is engageable with said extending portion.

26. An apparatus for positioning substrates on a receiving portion of a substrate support member, comprising:

a blade selectively actuable between an extended position and a retracted position to selectively position a substrate adjacent the substrate support member;

a lifting member having a first position wherein the substrate may be positioned adjacent the receiving potion, and a second position wherein said lifting member is positioned to lift the substrate from said blade;

a bias member to bias the lifting member from the second position to the first position; and an actuation member selectively engageable with said lifting member to selectively move said lifting member between said first position and said second position.

27. The apparatus of claim 26, wherein said substrate support member is positioned in a chamber having an enclosure wall; and said actuation member is extendable from said enclosure wall to selectively position said lifting member between said first position and said second position.

28. The apparatus of claim 27, further including a clamp member selectively positionable on said substrate support member.

29. The apparatus of claim 28, wherein said claim member includes:

a clamp ring positionable about a perimeter of a substrate received on said substrate support member; and a plurality of clamp fingers extending from said clamp ring and positionable in engagement with the substrate received on said substrate support member.

30. The apparatus of claim 29, further including a plurality of lifting members wherein said lifting members are affixed to said clamp ring.

31. The apparatus of claim 30, wherein said lifting members include a substrate receiving portion extending from said clamp ring and spaced, with respect to said clamp fingers, to provide a gap between said clamp fingers and said lifting members.

32. The apparatus of claim 30, wherein said substrate support member includes a recess into which said lifting members may be positioned.

33. The apparatus of claim 26, wherein:

the substrate support member is a cathode having at least two substrate receiving portions and the substrate support member is positioned in a chamber having an enclosure wall;

said enclosure wall including a slit valve to allow insertion and removal of the substrate therethrough; and said cathode is rotatable to align said substrate receiving portions with said slit valve.

34. An apparatus for processing substrates, comprising:

an enclosure;

a substrate support member within said enclosure;

said substrate support member including a plurality of substrate receiving surfaces;

said support member positionable in a first position wherein at least one of said substrate receiving surfaces is disposed in a horizontal position to receive a substrate thereon and a second position, different than said first position, for processing the substrate; and a clamp member selectively positionable with respect to said at least one substrate receiving face to engage the substrate.

35. An apparatus for positioning a substrate on a receiving face of a substrate support member, comprising:

a blade selectively movable between an extended position and retracted position to position a substrate adjacent the substrate support member, said substrate support member including a recess;

a clamp ring positionable about a perimeter of a substrate received on said substrate support member, and a plurality of clamp fingers extending from said clamp ring and positionable in engagement with the substrate on said substrate support member;

a lifting member affixed to said clamp ring;

said lifting member positionable in a first position wherein said lifting member is in said recess and said clamp fingers are engagement with the substrate on said substrate support member, a second position wherein said lifting member is extended from said substrate support member to position the substrate at a distance from said substrate support member, and an intermediate position between said first and second positions to locate the substrate on said blade;

a bias member to bias the lifting member from the second position to the first position; and an actuation member selectively engageable with said lifting member to move said lifting member between said first position and said second position.

* * * * *

UNITED STATES PATENT AND TRADEMARK OFFICE
CERTIFICATE OF CORRECTION

PATENT NO.   : 5,753,133

DATED        : 5/19/1998

INVENTOR(S)  : Wong et al.

It is certified that error appears in the above-identified patent and that said Letters Patent is hereby corrected as shown below:

In claims:

In column 15, line 47, following "lift" insert --member--;

Column 15, line 47, delete "wal" and insert --wall--.

Signed and Sealed this

Twenty-fifth Day of May, 1999

Attest:

Q. TODD DICKINSON

Attesting Officer    Acting Commissioner of Patents and Trademarks